(12) United States Patent
Kumar

(10) Patent No.: US 8,885,434 B2
(45) Date of Patent: Nov. 11, 2014

(54) RETENTION OF DATA DURING STAND-BY MODE

(75) Inventor: Ashish Kumar, Jharkhand (IN)

(73) Assignee: STMicroelectronics International N.V., Amsterdam (NL)

( * ) Notice: Subject to any disclaimer, the term of this patent is extended or adjusted under 35 U.S.C. 154(b) by 104 days.

(21) Appl. No.: 12/817,086

(22) Filed: Jun. 16, 2010

(65) Prior Publication Data

US 2010/0322016 A1 Dec. 23, 2010

(30) Foreign Application Priority Data

Jun. 17, 2009 (IN) .......................... 1249/DEL/2009

(51) Int. Cl.
*G11C 5/14* (2006.01)
*G11C 7/02* (2006.01)

(52) U.S. Cl.
CPC .......... *G11C 7/02* (2013.01); *G11C 2207/2227* (2013.01); *G11C 5/147* (2013.01)
USPC ...................... 365/226; 365/189.07

(58) Field of Classification Search
USPC ................................................ 365/226–229
See application file for complete search history.

(56) References Cited

U.S. PATENT DOCUMENTS

| | | | | |
|---|---|---|---|---|
| 5,371,705 A * | 12/1994 | Nakayama et al. | ...... | 365/185.23 |
| 6,759,852 B1 * | 7/2004 | Samad | .......... | 324/522 |
| 6,768,355 B1 * | 7/2004 | Henry et al. | .......... | 327/143 |
| 6,925,025 B2 * | 8/2005 | Deng et al. | .......... | 365/226 |
| 7,145,383 B2 * | 12/2006 | Mizuno et al. | .......... | 327/546 |
| 7,205,682 B2 * | 4/2007 | Kuramori | .......... | 307/80 |
| 7,453,756 B2 * | 11/2008 | Moyer et al. | .......... | 365/226 |
| 7,737,720 B2 * | 6/2010 | Idgunji et al. | .......... | 326/33 |
| 7,764,101 B2 * | 7/2010 | Wu et al. | .......... | 327/205 |
| 2009/0115258 A1 * | 5/2009 | Flynn et al. | .......... | 307/129 |
| 2011/0102072 A1 * | 5/2011 | Idgunji et al. | .......... | 327/540 |
| 2012/0147688 A1 * | 6/2012 | Chen et al. | .......... | 365/229 |

* cited by examiner

*Primary Examiner* — Kretelia Graham
(74) *Attorney, Agent, or Firm* — Graybeal Jackson LLP

(57) ABSTRACT

An embodiment of the present disclosure refers to retention of data in a storage array in a stand-by mode. A storage device comprises one or more storage array nodes, and a Rail to Rail voltage adjustor operatively coupled to the storage array nodes. The Rail to Rail voltage adjustor is configured to selectively alter the voltage provided at each said storage array node during stand-by mode. The storage device may further comprise a storage array operatively coupled to said Rail to Rail voltage adjustor and a Rail to Rail voltage monitor operatively coupled to said storage array nodes and configured to control said Rail to Rail voltage adjustor to provide sufficient voltage to retain data during stand-by mode.

30 Claims, 8 Drawing Sheets

RETENTION OF DATA DURING STAND-BY MODE

PRIORITY CLAIM

The instant application claims priority to Indian Patent Application No. 1249/Del/2009, filed Jun. 17, 2009, which application is incorporated herein by reference.

TECHNICAL FIELD

An embodiment of the present disclosure relates to retention of data in storage arrays and more particularly, but not limited to, retention of data in a storage array during stand-by mode.

BACKGROUND

The following description of the background art may include insights, discoveries, understandings or disclosures, or associations together with disclosures not known to the relevant art but provided by the disclosure. Some such contributions of the disclosure may be specifically pointed out below, whereas other such contributions will be apparent from their context.

The terms 'stand by' and 'sleep mode' as well as 'memory', 'data storage array' and 'storage array' have been used interchangeably throughout the present disclosure.

Memories comprise several memory columns comprising memory cells for storage and access of data. However, each column conducts a leakage current which increases with increase in the supply voltage of the memory. The larger the memory size, the more leakage current and power consumption by the memory.

To reduce leakage in memory devices comprising said memory, stand by mode is utilized wherein reduced voltages are applied during inactive phases of a circuit such as during outside read and write phases. However, when Rail to Rail voltage across a memory decreases below a set threshold voltage, the circuit may switch states in response to the disturbances. The difference between a higher voltage being applied at one terminal of a memory core and a lower voltage being applied at the second terminal of the memory terminal is referred to as Rail to Rail (RTR) voltage.

In view of the above, data retention power gating is used such that when the memory goes into the stand-by mode; sufficient voltage is present across the memory to retain the data. However, there are cases when the supply voltage is very low and data retention with sufficient noise margin may be difficult to achieve.

BRIEF DESCRIPTION OF THE DRAWINGS

Embodiments and features of the present disclosure will be explained in the following non-limiting description, taken in conjunction with the accompanying drawings, wherein.

DETAILED DESCRIPTION

Figure 1:
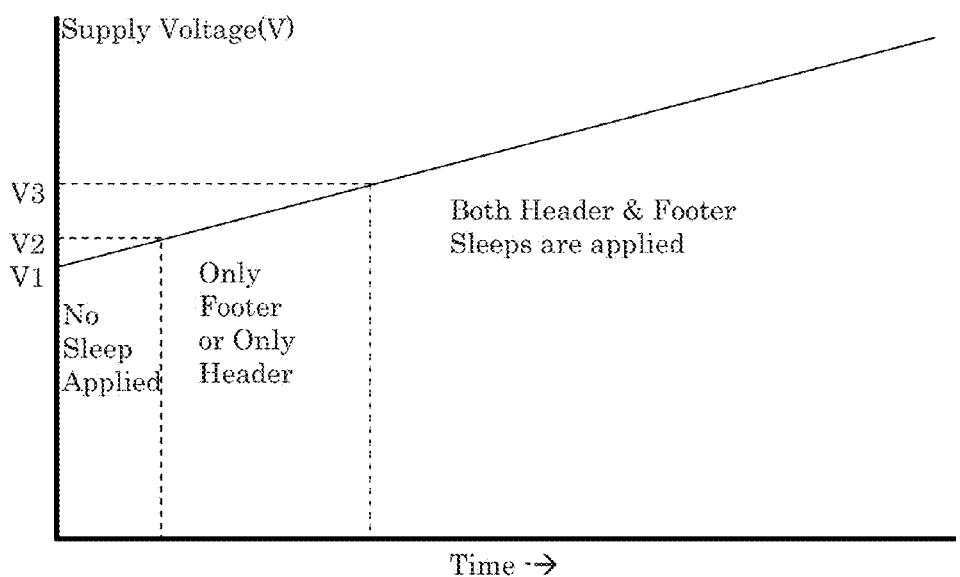
FIG. 1 illustrates a graphical representation of an embodiment of the present disclosure.

Embodiments of the present disclosure will now be described in detail with reference to the accompanying drawings. However, the present disclosure is not limited to these embodiments. The present disclosure can be modified in various forms. Thus, the embodiments of the present disclosure are only provided to explain more clearly the present disclosure to the ordinarily skilled in the art of the present disclosure. In the accompanying drawings, like reference numerals are used to indicate like components.

An embodiment of the present disclosure describes a storage device capable of retaining data in a stand-by mode. The storage device comprises one or more storage array nodes, a Rail to Rail (RTR) voltage adjustor, a storage array operatively coupled to said RTR voltage adjustor and a RTR voltage monitor. The RTR voltage adjustor is operatively coupled to one or more supply voltage nodes and is configured to selectively alter the voltage provided at each said storage array node during the stand-by mode. This is implemented by controlling the RTR voltage adjustor by the RTR voltage monitor such that sufficient voltage is provided across the storage array to retain data during stand-by mode. An example of an embodiment of the present disclosure comprises two supply voltage nodes providing voltage $V_{DD}$ and ground $V_{GND}$ to two storage array nodes of said storage array wherein the storage array comprises an array of memory cell rows and columns operable in a stand-by mode.

FIG. 1 illustrates a graphical representation of an embodiment of the present disclosure. As is clear from the graph plotted between the Rail to Rail (RTR) voltage and time, the RTR voltage is monitored, and in accordance with set supply voltages V1, V2, and V3 (where V1<V2<V3), stand-by mode is applied. V1 is the minimum supply voltage required to retain data in a storage array. If at a given point of time, the operating band of the RTR voltage lies between supply voltages V1 and V2 (range of V1-V2 is referred to as an operating band of low voltages), there is no sleep i.e., stand-by mode applied at header and footer of said storage device as the voltage is sufficient enough to retain data and also leakage encountered is minimal. Thus, exhibiting that even at very low voltages the storage device is capable of retaining data. However, if the operating band of the RTR voltage falls between supply voltages V2 and V3 (range of V2-V3 is referred to as an operating band of intermediate voltages), sleep is applied to either the header or footer of the storage device However, should the operating band of the RTR voltage be greater than supply voltage V3 (range of >V3 is referred to as an operating band of high voltages), sleep is applied to both the header and footer of the storage device. Thus, various embodiments of the present disclosure follow a dynamic mechanism of applying stand-by mode in a storage device such that an effective retention noise margin is maintained whenever the RTR voltage is selectively altered.

Figure 2:
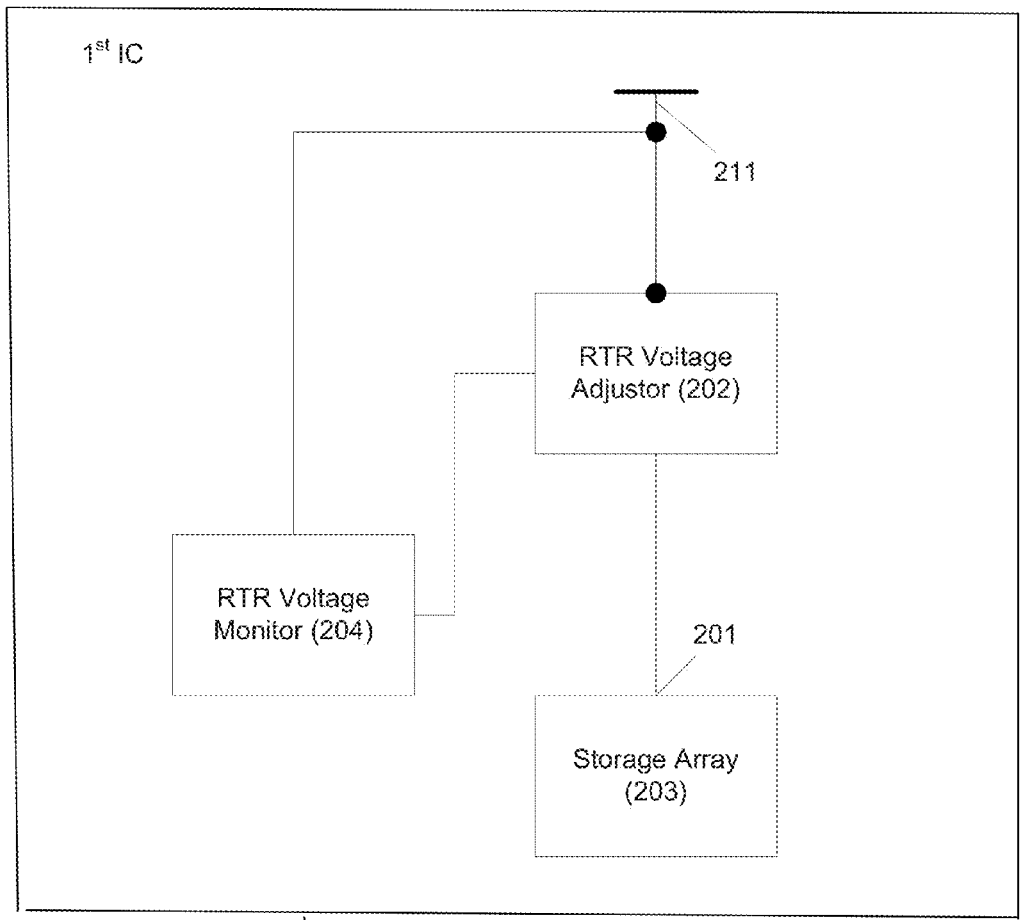
FIGS. 2A and 2B illustrate block diagrams representation of a storage device capable of retaining data in stand-by mode in accordance with an embodiment of the present disclosure.

FIG. 2A illustrates a block diagram representation of a storage device capable of retaining data in stand-by mode in accordance with an embodiment of the present disclosure. The storage device comprises one or more storage array nodes 201, a Rail to Rail (RTR) voltage adjustor 202 operatively coupled to a storage array 203 and a Rail to Rail (RTR) voltage monitor 204 operatively coupled to supply voltage node 211 and configured to control said RTR voltage adjustor to provide sufficient voltage to retain data in the storage array during stand-by mode. The storage array node 201 is operatively coupled to the RTR voltage adjustor 202, which comprises at least one switched voltage reduction elements such as controllable diodes.

During a stand-by mode, the RTR voltage adjustor 202 selectively alters the voltage provided at each said storage array node 201 on receiving control by the RTR voltage monitor 204. The monitor 204 tracks the RTR voltage along the supply voltage and in accordance with the graphical representation illustrated in FIG. 1 sends a control signal to the RTR voltage adjustor 202 to configure either header or footer or both in stand-by mode. Accordingly RTR voltage at each storage array node 201 is altered depending on the supply voltage provided and leakage is reduced and data is retained. Further, FIG. 2A shows a controller disposed on a separate integrated circuit die coupled to a first integrated circuit die upon which the storage device is disposed FIG. 2B also illustrates a block diagram representation of a storage device capable of retaining data in stand-by mode in accordance with an embodiment of the present disclosure. In this embodiment, the controller and the storage device are disposed on a single integrated circuit die.

Figure 3:
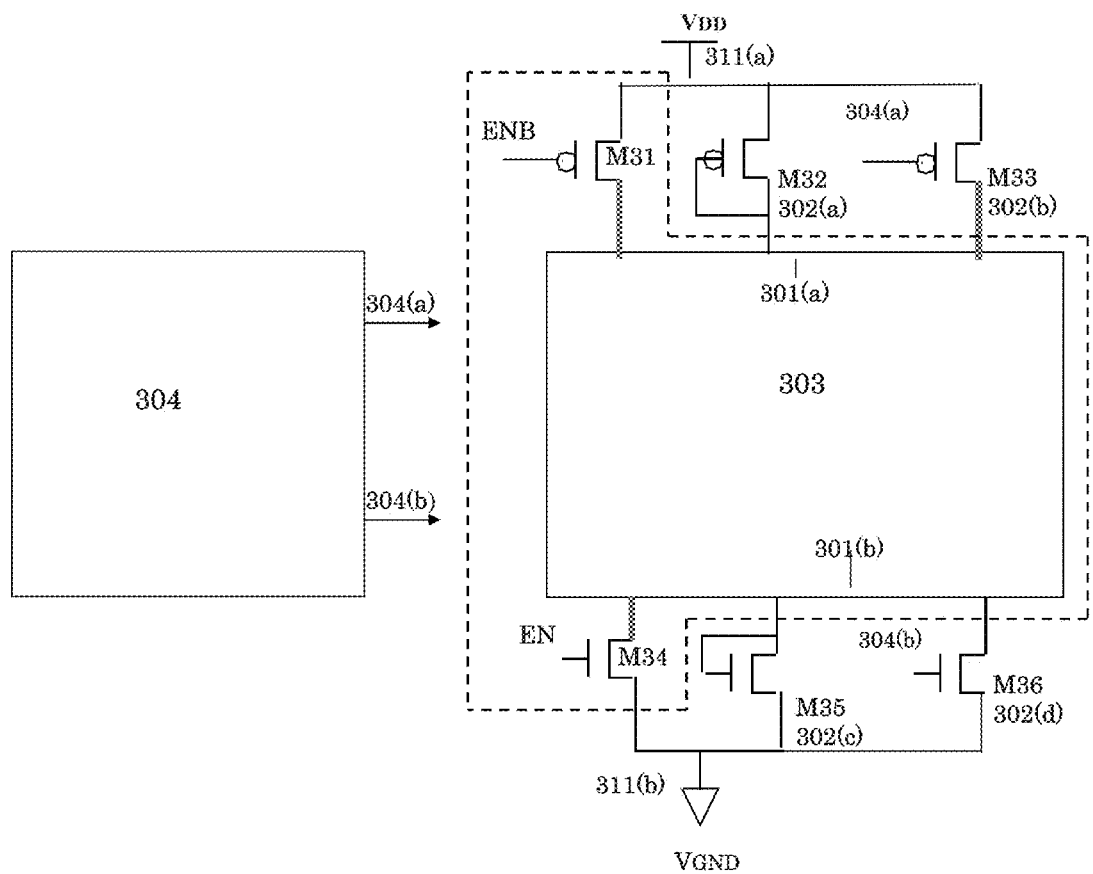
FIG. 3 illustrates an elemental representation of a storage device capable of retaining data during stand-by mode in accordance with an embodiment of the present disclosure.

FIG. 3 illustrates an elemental representation of a storage device capable of retaining data during stand-by mode in accordance with an embodiment of the present disclosure. Transistors M31 and M34 and memory core form the data storage array 303 wherein said memory core is enabled through ENB and EN. The data storage array 303 receives supply voltages at $V_{DD}$ and $V_{GND}$ at two supply voltage nodes 311(a), 311(b) as shown in the figure.

Transistors M32 302(a), M33 302(b), M35 302(c) and M36 302(d) form the RTR voltage adjustor wherein 302(a) and 302(b) form a header of the storage device while 302(c) and 302(d) form a footer of the storage device. 304 indicates the RTR voltage monitor where according to an embodiment of the present disclosure, the monitor is a low leakage tracking block. The low leakage tracking block 304 tracks and monitors the RTR voltage and accordingly produces control signals 304(a) and 304(b) to control the header 302(a), 302(b) and footer 302(c), 302(d) of the storage device. This control then selectively alters the voltage across storage array nodes 301(a) and 301(b).

In accordance with an embodiment as well as referring to the illustration of FIG. 1, when the RTR voltage at storage array node 301(a), 301(b) lies between supply voltages V1 and V2, no sleep is applied to the storage device as the voltage is sufficient to retain data. That is, neither of the signals 304(a) or 304(b) are asserted by the voltage monitor 304, and no sleep mode is activated. However, when the RTR voltage at storage array node 301(a), 301(b) lies between supply voltages V2 and V3, sleep is applied to the header 302(a), 302(b). However, if the RTR voltage at the node exceeds supply voltage V3, sleep is applied to the header 302(a), 302(b) as well as the footer 302(c), 302(d) of the storage device. This ensures that increase in leakage current due to increase in supply voltage is kept in check and that the data is retained while maintaining effective retention noise margin.

Figure 4:
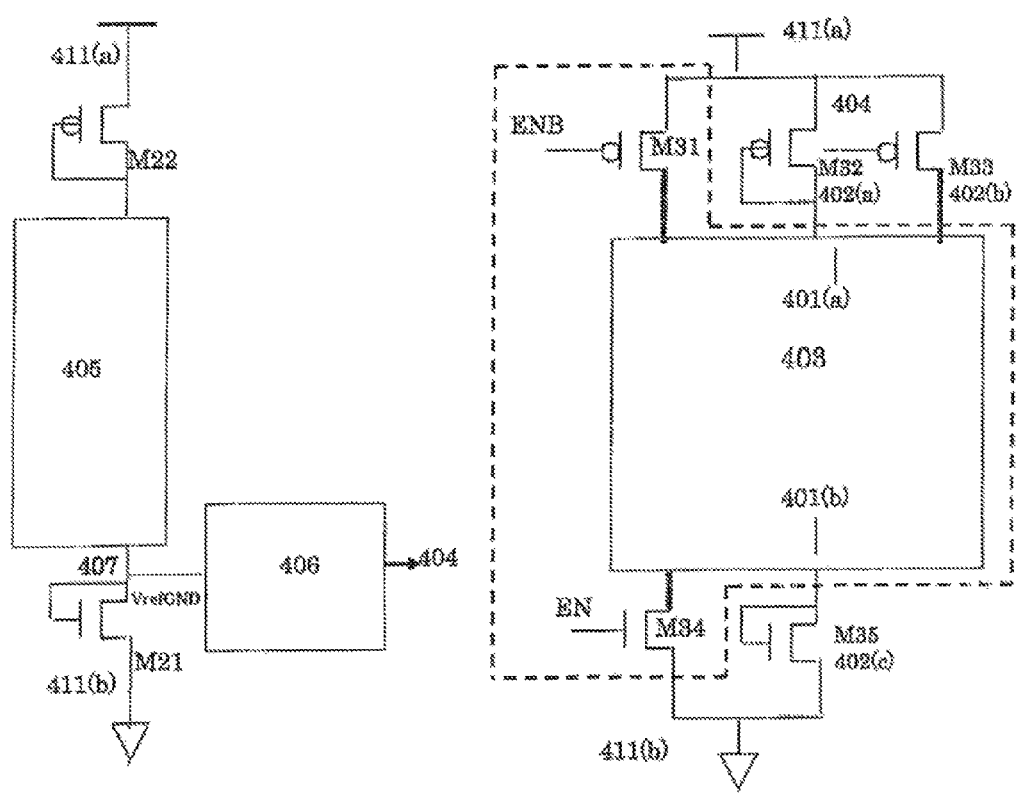
FIG. 4 illustrates a low leakage tracking block in accordance with an embodiment of the present disclosure.

FIG. 4 describes yet another embodiment of the present disclosure wherein a low leakage tracking block is illustrated. The current embodiment refers to a scenario when the RTR voltage falls between the range of supply voltages V2 and V3. Accordingly, in the current embodiment the header is configured to the sleep mode while the footer remains active.

The low leakage tracking block comprises a reference column 405 the RTR voltage (e.g., the voltage between 411(a) and 411(b) at its terminals through diodes M22 and M21 coupled to nodes 411(a) and 411(b). The reference column 405 comprises more memory cells N' per column than the columns in the storage array and is approximated by:

$$N' = kN$$

Where
N=number of memory cells in normal column in the storage array
N'=number of memory cells in reference column
k=multiplying factor The low leakage tracking block also comprises a level sensing block 406 operatively coupled to the reference column 405 receiving $V_{refGND}$ from node 407. The voltage $V_{refGND}$ at node 407 is dependent on leakage of the reference column 405, thus making first and second control signals 404 dependent on leakage. Hence, configuration of the RTR voltage adjustor is dynamically controlled. In an embodiment, as the RTR voltage is within the range of supply voltages V2 and V3, the header of the RTR voltage adjustor is configured to the stand-by mode by the control signal 404. That is, the transistor M33 is turned off to increase the impedance, and thus increase the voltage drop, between the nodes 411(a) and 401(a), this reduces the voltage across the array 403, and thus helps maintain the leakage within the array 403 to an acceptable level. A footer circuit between the nodes 401(b) and 411(b) may operate in a similar manner.

Figure 5:
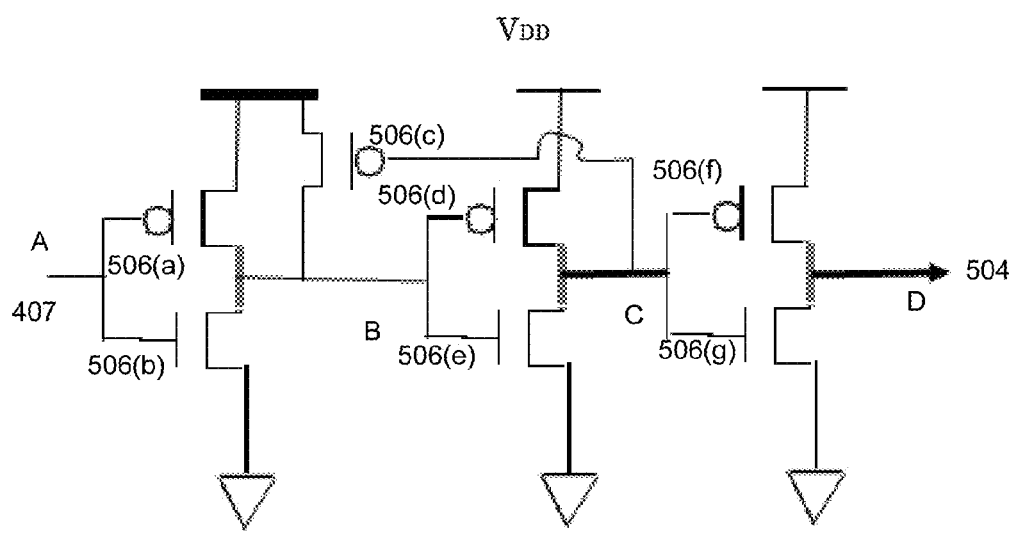
FIG. 5 illustrates a level sensing block in accordance with an embodiment of the present disclosure.

FIG. 5 describes a level sensing block in accordance with an embodiment of the present disclosure. The level sensing block comprises a non inverting buffer with hysteresis i.e., a Schmitt trigger. The buffer comprises a plurality of transistors 506(a), 506(b), 506(c), 506(d), 506(e), 506(f) and 506(g) configured as inverters wherein switch point of inverters 506(a)/506(b), 506(d)/506(e) and 506(f)/506(g) is set by a switch point ratio factor multiplied by $V_{DD}$. Assuming that Node A is initially logic "1" as $V_{DD}$ begins to rise, Node B will be equivalent to logic "0", Node C to that of logic "1" and Node D shall be equivalent to logic "0". Transistor 506(c) is such a case shall be OFF. However, as $V_{DD}$ rises above a certain threshold voltage, the switch point rises to a voltage above voltage at Node A. Therefore, Node A appears as logic "0", Node B appears as logic "1", Node C as logic "0" and Node D as logic "1" while transistor 506(c) is turned ON.

The logic signal at Node D in turn controls and triggers the header and footer of the RTR voltage adjustor of the storage device and is referred to as the control signal 504. Transistor 506(c) of the level sensing block adds hysteresis to the buffer so that the switch point of 506(a)/506(b) will be higher and $V_{DD}$ will have to drop lower before reset becomes active again.

Referring to the embodiment described in FIG. 4 of the present disclosure, it is clear that as $V_{DD}$ rises above a set supply voltage, i.e., V2, the logic at Node D becomes "1" and hence, the header moves into the sleep mode by turning off transistor M33, thereby ensuring that leakage is maintained relatively low, retention noise margin is maintained, and data is retained. FIG. 4 is specific to the case wherein $V2 < V_{DD} < V3$.

However, in another embodiment of the present disclosure, when $V_{DD}$>V3, two control signals are generated by an embodiment of a mechanism similar to that illustrated in FIG. 5 wherein the signals configure both header and footer in stand-by mode. Because the footer may include NMOS transistors, the signal at node 504 may be inverted before being provided to the footer.

Figure 6:
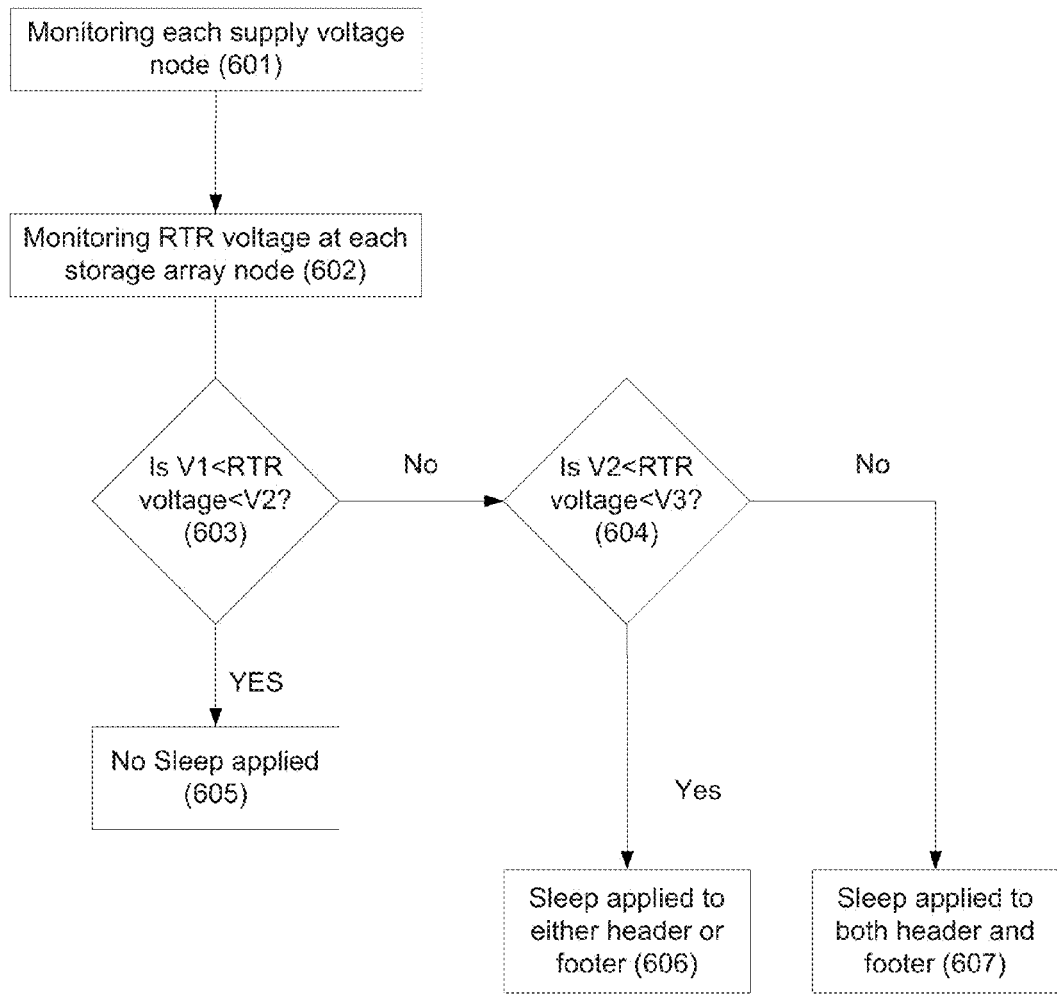
FIG. 6 illustrates a flow diagram representation of a method for retention of data in storage arrays during stand-by mode in accordance with an embodiment of the present disclosure.

An embodiment of a method to reduce leakage in a storage array in a stand-by mode is described in FIG. 6. The method is illustrated as a collection of blocks in a logical flow graph, which represents a sequence of operations that can be implemented in hardware, software, or a combination thereof. The order in which the process is described is not intended to be construed as a limitation, and any number of the described blocks may be combined in any order to implement the process, or an alternate process.

FIG. 6 illustrates a flow diagram representation of a method to retain data in a storage device in a stand-by mode. The supply voltage as well as the Rail to Rail (RTR) voltage at the storage array nodes are constantly monitored at blocks 601 and 602. The operating band of Rail to Rail (RTR) voltage is then determined (blocks 603, 604) by checking the RTR voltage against the set supply voltages such as V1, V2 and V3 described in embodiment illustrated by FIG. 1. Therefore, it is first verified, whether the RTR voltage lies between supply voltages V1 and V2 at block 603, i.e., an operating band of low voltages. If Yes, then no sleep is applied to either header or footer at block 605; else, it is verified whether the RTR voltage lies between supply voltages V2 and V3 at block 604, i.e., an operating band of intermediate voltages. If Yes, then either of the header or footer is configured to stand-by mode at block 606; else, sleep is applied to both header and footer at block 607 as the RTR voltage is then>supply voltage V3, which is an operating band of high voltages. Therefore, on determining the operating band of the RTR voltage, the voltage provided at each storage array node is selectively altered.

Figure 7:
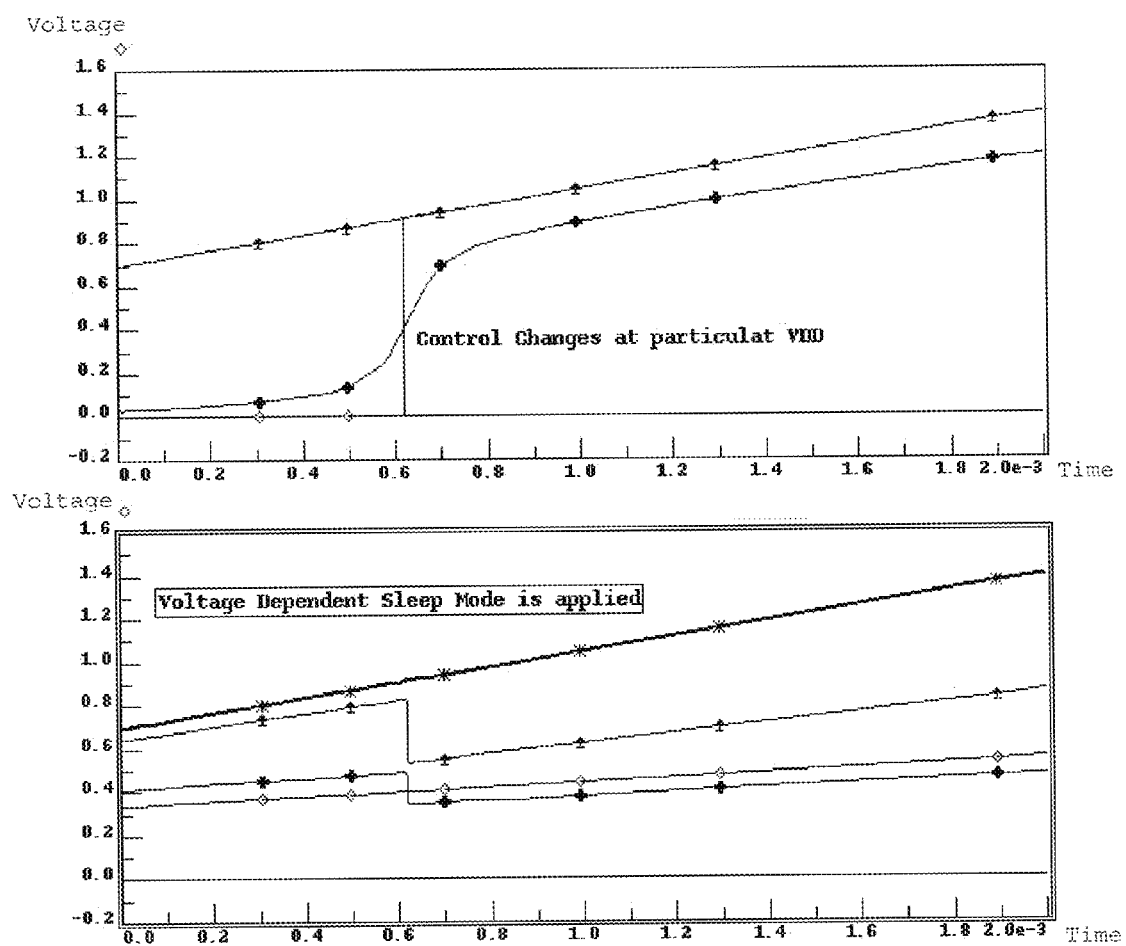
FIG. 7 illustrates a graphical representation of generation of control signal by the Rail to Rail (RTR) voltage monitor in accordance with an embodiment of the present disclosure.

FIG. 7 illustrates a graphical representation of generation of a control signals by the RTR voltage monitor in accordance with an embodiment of the present disclosure where the representation is plotted over voltage and time. As is clear from the representation, at around VDD=0.82V the RTR voltage monitor generates a control signal which applies full sleep to the memory core at higher supply voltages, i.e., the entire memory core is configured to stand-by mode at a higher supply voltage VDD. Thus, the issue of noise margin at low voltages where stability is a concern rather than leakage current is effectively dealt with.

Figure 8:
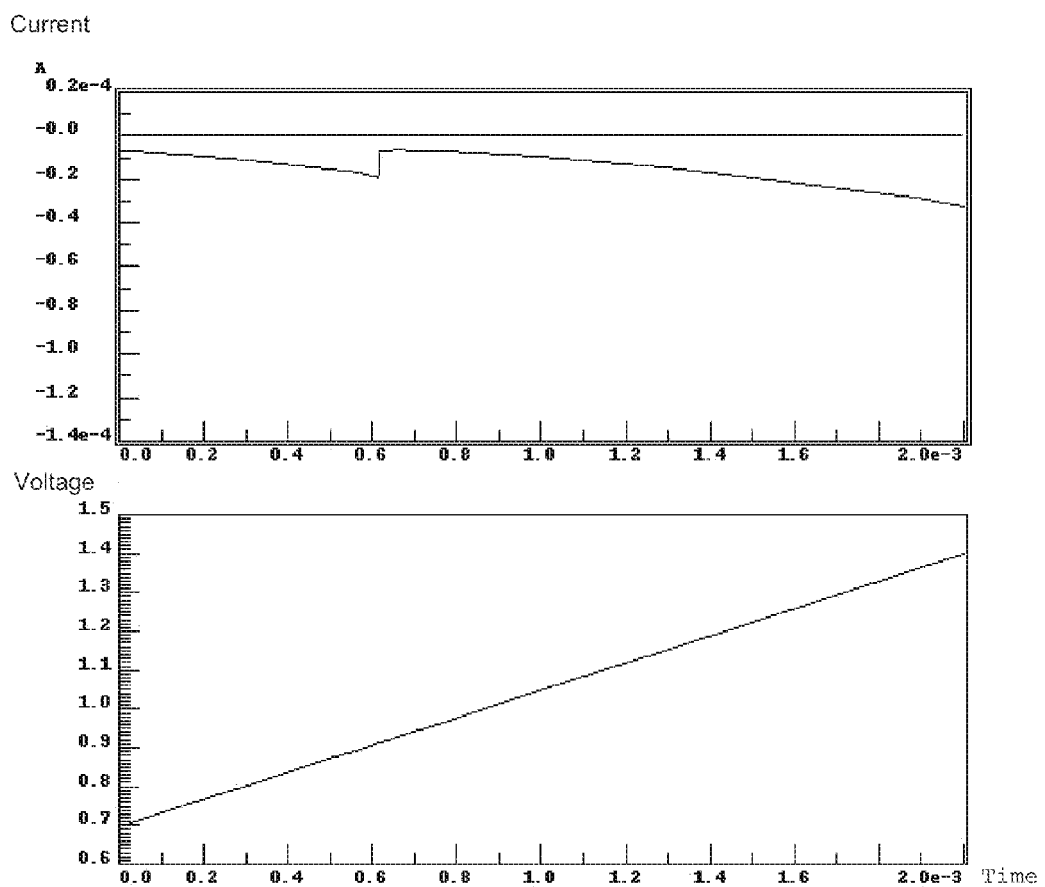
FIG. 8 illustrates a graphical representation of leakage variation with respect to current in accordance with an embodiment of the present disclosure.

FIG. 8 describes a graphical representation of leakage variation with respect to current in accordance with an embodiment of the present disclosure. At low voltage supply available at the supply voltage nodes, only the footer control is implemented hence, there is less reduction in leakage. At around 0.82V, the header control is also triggered to be active and leakage reduction is more. A critical leakage zone for the device is at higher voltages where full sleep is applied i.e., both header and footer are inactive.

Various embodiments of the present disclosure are applicable to all volatile memories such as SRAM (Static Random Access Memory), DRAM (Dynamic Random Access Memory) as well as a few ROM architectures.

Embodiments of the present disclosure utilize less area where in specific cases of implementation have resulted in a penalty less than 0.2% of memory area as was being utilized previously. Further, specific cases have also resulted in a 100% increase in RNM (Retention Noise Margin) at low voltages.

A memory with sleep circuitry as described above may be coupled to another integrated circuit (IC), such as a processor or controller to form a system.

Furthermore, sleep circuitry such as described above may be used in other than memory circuits.

Although the disclosure of system and method has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

The various embodiments described above can be combined to provide further embodiments. Aspects of the embodiments may be modified, if necessary to employ concepts of the various patents, applications and publications to provide yet further embodiments.

These and other changes may be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A power controller, comprising:
   a first input supply node configured to receive a first input supply signal;
   a first output supply node configured to provide a first output supply signal;
   a monitor configured to monitor the first input supply signal and configured to determine if the first input supply signal is less than a first threshold, if the first input supply signal is greater than the first threshold but less than a second threshold, and if the first input supply signal is greater than the second threshold; and
   an adjuster configured to adjust the first output supply signal in a first manner in response to the monitor determining the first input supply signal is less than the first threshold and configured to adjust the first output supply signal in a second manner in response to the monitor determining the first input supply signal is greater than the first threshold but less than the second threshold and configured to adjust the first output supply signal in a third manner in response to the monitor determining the first input supply signal is greater than the second threshold;
   wherein the adjuster is configured to adjust an impedance between the first input supply node and the first output supply node in response to the monitor.

2. The power controller of claim 1 wherein the monitor is configured to determine a level of the first input supply signal at the first input supply node relative to at least one reference signal level.

3. A power controller, comprising:
   a first input supply node configured to receive a first input supply signal;
   a first output supply node configured to provide a first output supply signal;

a monitor configured to monitor the first input supply signal and configured to determine if the first input supply signal is less than a first threshold, if the first input supply signal is greater than the first threshold but less than a second threshold, and if the first input supply signal is greater than the second threshold; and an adjuster configured to adjust the first output supply signal in a first manner in response to the monitor determining the first input supply signal is less than the first threshold and configured to adjust the first output supply signal in a second manner in response to the monitor determining the first input supply signal is greater than the first threshold but less than the second threshold and configured to adjust the first output supply signal in a third manner in response to the monitor determining the first input supply signal is greater than the second threshold;

wherein the monitor comprises:

a column of memory cells coupled to the first input supply node; and a comparator coupled to the column and configured to generate a comparison signal; and the adjuster is configured to adjust the first output supply signal in response to the comparison signal.

4. The power controller of claim 1 wherein:
the comparator comprises
a Schmidt trigger.

5. The power controller of claim 1 wherein the adjuster comprises a transistor having a conduction path coupled between the first input supply node and the first output supply node and having a control node coupled to the monitor.

6. The power controller of claim 1 wherein:
the first input supply signal comprises a first input supply voltage; and
the first output supply signal comprises a first output supply voltage.

7. The power controller of claim 1, further comprising:
a second input supply node configured to receive a second input supply signal;
a second output supply node configured to provide a second output supply signal; and
wherein the adjuster is configured to adjust the second output supply signal in response to the monitor.

8. The power controller of claim 7 wherein the adjuster is configured to adjust a first impedance between the first input supply node and the first output supply node and a second impedance between the second input and output supply nodes in response to the monitor.

9. The power controller of claim 7 wherein the adjuster comprises:
a first transistor having a conduction path coupled between the first input supply node and the first output supply node and having a control node coupled to the monitor; and
a second transistor having a conduction path coupled between the second input supply node and the second output supply node and having a control node coupled to the monitor.

10. The power controller of claim 7 wherein:
the first input supply signal and the second input supply signal respectively comprise first and second input supply voltages; and
the first output supply signal and the second output supply signal respectively comprise first and second output supply voltages.

11. An integrated circuit, comprising:
a first input supply node configured to receive a first input supply signal;
a first output supply node configured to provide a first output supply signal;
a monitor configured to monitor the first input supply signal and configured to determine if the first input supply signal is less than a first threshold, if the first input supply signal is greater than the first threshold but less than a second threshold, and if the first input supply signal is greater than the second threshold; and
an adjuster configured to adjust the first output supply signal by adjusting an impedance between the first input supply node and the first output supply node in a first manner in response to the monitor determining the first input signal is less than the first threshold and configured to adjust the first output supply signal in a second manner in response to the monitor determining the first input signal is greater than the first threshold but less than the second threshold and configured to adjust the first output supply signal in a third manner in response to the monitor determining the first input signal is greater than the second threshold; and
an array of circuit elements having a first array supply node coupled to the first output supply node.

12. The integrated circuit of claim 11, further comprising:
a second input supply node configured to receive a second input supply signal;
a second output supply node configured to provide a second output supply signal;
wherein the adjuster is configured to adjust the second output supply signal in response to the monitor; and
wherein the array has a second array supply node coupled to the second output supply node.

13. The integrated circuits of claim 11 wherein at least some of the circuit elements of the array comprise memory cells.

14. A system, comprising:
a first integrated circuit, comprising:
a first input supply node configured to receive a first input supply signal;
a first output supply node configured to provide a first output supply signal;
a monitor configured to monitor the first input supply signal and configured to determine if the first input supply signal is less than a first threshold, if the first input supply signal is greater than the first threshold but less than a second threshold, and if the first input supply signal is greater than the second threshold; and
an adjuster configured to adjust the first output supply signal by adjusting an impedance between the first input supply node and the first output supply node in a first manner in response to the monitor determining the first input signal is less than the first threshold and configured to adjust the first output supply signal in a second manner in response to the monitor determining the first input signal is greater than the first threshold but less than the second threshold and configured to adjust the first output supply signal in a third manner in response to the monitor determining the first input signal is greater than the second threshold; and
an array of circuit elements having a first array supply node coupled to the first output supply node; and
a second integrated circuit coupled to the first integrated circuit.

15. The system of claim 14 wherein the second integrated circuit comprises a controller.

16. The system of claim 14 wherein the first integrated circuit and the second integrated circuit are disposed on a same integrated circuit die.

17. The system of claim 14 wherein the first integrated circuit and the second integrated circuit are disposed on respective integrated circuit dies.

18. A method, comprising:
monitoring a first input supply signal in relation to a plurality of ranges such that a first range is between a second range and a third range; and
varying a first output supply signal in response to the first input supply signal in relation to the plurality of ranges by varying an impedance disposed between the first input supply signal and a second input supply signal.

19. The method of claim 18 wherein:
monitoring comprises monitoring a level of the first input supply signal; and
varying comprises varying a level of the first output supply signal in response to the level of the first input supply signal.

20. The method of claim 18, further comprising generating the first output supply signal from the first input supply signal.

21. A method, comprising:
monitoring a first input supply signal in relation to a plurality of ranges such that a first range is between a second range and a third range; and
varying a first output supply signal in response to the first input supply signal in relation to the plurality of ranges;
wherein the monitoring comprises determining whether the first input supply signal is less than a first reference value; and
varying the first output supply signal comprises causing an impedance between the first input and output supply signals to have a higher value if the first input supply signal is greater than the first reference value.

22. A method comprising:
monitoring a first input supply signal in relation to a plurality of ranges such that a first range is between a second range and a third range; and
varying a first output supply signal in response to the first input supply signal in relation to the plurality of ranges;
wherein the monitoring comprises determining whether the first input supply signal is less than a first reference value; and
varying the first output supply signal comprises causing the first output supply signal to have a substantially constant level regardless of whether the first input supply signal is less than or greater than the first reference value.

23. The method of claim 18 wherein:
monitoring comprises determining whether the first input supply signal is less than a first reference value, between the first reference value and a second reference value, or greater than the second reference value; and
varying the first output supply signal comprises causing the first output supply signal to have a substantially constant level regardless of whether the first input supply signal is less than the first reference value, between the first reference value and the second reference value, or greater than the second reference value.

24. The method of claim 18 wherein:
monitoring comprises determining whether the first input supply signal is between a first reference value and a second reference value, between the second reference value and a third reference value, or greater than the third reference value; and
varying the first output supply signal comprises causing the first output supply signal to have a substantially constant level regardless of whether the first input supply signal is between the first reference value and the second reference value, between the second reference value and the third reference value, or greater than the third reference value.

25. The method of claim 18 wherein:
monitoring comprises determining whether the first input supply signal is less than a first reference value;
varying the first output supply signal comprises causing the first output supply signal to have a level within a range regardless of whether the first input supply signal is less than or greater than the first reference value, the range causing a memory array coupled to the first output supply signal to retain its contents and to have a leakage current that is less than a threshold.

26. A method, comprising:
monitoring a first input supply signal; and
varying a first output supply signal in response to the first input supply signal; the method further comprising:
wherein monitoring comprises determining whether the first input supply signal is less than a first reference value, between the first reference value and a second reference value, or greater than the second reference value;
varying the first output supply signal comprises causing the first output supply signal to have a level within a range regardless of whether the first input supply signal is less than the first reference value, between the first and second reference values, or greater than the second reference value, the range causing a memory array coupled to the first output supply signal to retain its contents and to have a leakage current that is less than a threshold.

27. A method, comprising:
monitoring a first input supply signal; and
varying a first output supply signal in response to the first input supply signal; the method further comprising:
wherein monitoring comprises determining whether the first input supply signal is between a first reference value and a second reference value, between the second reference value and a third reference value, or greater than the third reference value;
varying the first output supply signal comprises causing the first output supply signal to have a level within a range regardless of whether the first input supply signal is between the first reference value and the second reference value, between the second reference value and the third reference value, or greater than the third reference value, the range causing a memory array coupled to the first output supply signal to retain its contents and to have a leakage current that is less than a threshold.

28. A method, comprising:
monitoring a first input supply signal; and
varying a first output supply signal in response to the first input supply signal; the method further comprising:
wherein monitoring comprises determining whether the first input supply signal is less than a first reference value, between the first reference value and a second reference value, or greater than the second reference value;
varying the first output supply signal comprises causing the first output supply signal to have a level within a first range regardless of whether the first input supply signal is less than the first reference value, between the first reference value and the second reference value, or greater than the second reference value;
varying a second output supply signal by causing the second output supply signal to have a level within a second range regardless of whether the first input supply signal is less than the first reference value, between the first reference value and the second reference value, or greater than the second reference value; and wherein the first range and the second range cause a memory array coupled to the first output supply signal and second output supply signal to retain its contents and to have a leakage current that is less than a threshold.

29. A power controller, comprising:

a first supply node and a second supply node configured to provide supply signal corresponding to a voltage between the first supply node and the second supply node;

a monitor configured to monitor the voltage;

a first adjuster having a first impedance coupled to the first supply node and configured to adjust the first impedance in response monitoring the voltage in a first range; and a second adjuster having a second impedance coupled to the second supply node and configured to adjust the second impedance in response monitoring the voltage in a second range.

30. A system, comprising:

a first integrated circuit, comprising:

a first supply node and a second supply node configured to provide supply signal corresponding to a voltage between the first supply node and the second supply node;

a monitor configured to monitor the voltage;

a first adjuster having a first impedance coupled to the first supply node and configured to adjust the first impedance in response monitoring the voltage in a first range; and a second adjuster having a second impedance coupled to the second supply node and configured to adjust the second impedance in response monitoring the voltage in a second range.

* * * * *